United States Patent [19]

Nguyen

[11] Patent Number: 6,013,399
[45] Date of Patent: Jan. 11, 2000

[54] REWORKABLE EUV MASK MATERIALS

[75] Inventor: Khanh B. Nguyen, San Mateo, Calif.

[73] Assignee: Advanced Micro Devices, Inc., Sunnyvale, Calif.

[21] Appl. No.: 09/205,958

[22] Filed: Dec. 4, 1998

[51] Int. Cl.[7] .................................................. G03F 9/00
[52] U.S. Cl. ................................................................. 430/5
[58] Field of Search ............................... 430/5, 322, 394; 378/35

[56] References Cited

U.S. PATENT DOCUMENTS

| | | | |
|---|---|---|---|
| 4,539,278 | 9/1985 | Willliams et al. | 430/5 |
| 4,604,292 | 8/1986 | Evans et al. | 427/39 |
| 5,199,055 | 3/1993 | Noguchi et al. | 378/35 |
| 5,310,603 | 5/1994 | Fukuda et al. | 428/446 |
| 5,399,448 | 3/1995 | Nagata et al. | 430/5 |
| 5,572,564 | 11/1996 | Murakami | 378/35 |
| 5,698,113 | 12/1997 | Baker et al. | 216/72 |
| 5,958,629 | 9/1999 | Yan et al. | 430/5 |

OTHER PUBLICATIONS

"EUV Reticle Pattern Repair Experiments using 10 KeV Neon Ions", A. M. Hawryluk, D. R. Kania, P. Celliers, L. DaSilva, A. Stith, D. Stewart, and S. Mrowka; OSA Proceedings on Extreme Ultraviolet Lithography, 1994, vol. 23,5 pages.

"Trends in Optics and Photonics", Extreme Ultraviolet Lithography, OSA Optical Society of America, TOPS vol. IV,6 pages.

"SolidState Technology", The International Magazine for Semiconductor Manufacturing, Jul. 1997, vol. 40, No. 7, 6 pages.

"SolidState Technology", The International Magazine for Semiconductor Manufacturing, Aug. 1997, vol. 40, No. 8, 4 pages.

"Mask technologies for soft–x–ray projection lithography at 13 nm", Applied Optics, Dec. 1, 1993, vol. 32, No. 34, 5 pages.

"Optical Fabrication and Testing", 1996 Technical Digest Series, vol. 7, 5 pages.

"Silicon–On–Insulator by Wafer Bonding: A Review", J. Electrochem. Soc., vol. 138, No. 1 Jan. 1991, The Electrochemical Society, Inc., 7 pages.

*Primary Examiner*—S. Rosasco
*Attorney, Agent, or Firm*—Amin Eschweiler & Turocy, LLP

[57] ABSTRACT

A reworkable EUV mask (100) includes a substrate (40), a reflective layer (42) overlying the substrate (40), and a buffer layer (44) overlying the reflective layer (42). An absorbing layer (102) composed of primarily a non-heavy metal material overlies the buffer layer (44) for absorbing radiation which is incident thereon. The absorbing layer (102) exhibits a substantially high etch selectivity with respect to the reflective layer (42) and thus is easily removed without substantially impacting the reflectivity of the reflective layer (42) during rework.

21 Claims, 3 Drawing Sheets

REWORKABLE EUV MASK MATERIALS

FIELD OF THE INVENTION

The present invention generally relates to lithography and more particularly relates to an EUV mask and a method of fabricating an EUV mask which permit the EUV mask to be reworked easily and reliably.

BACKGROUND OF THE INVENTION

In the semiconductor industry, there is a continuing trend toward higher device densities. To achieve these high densities there has been, and continues to be, efforts toward scaling down the device dimensions on semiconductor wafers. In order to accomplish such a high device packing density, smaller features sizes are required. This may include the width and spacing of interconnecting lines and the surface geometry such as the corners and edges of various features.

The requirement of small features with close spacing between adjacent features requires high resolution photolithographic processes. In general, lithography refers to processes for pattern transfer between various media. It is a technique used for integrated circuit fabrication in which, for example, a silicon wafer is coated uniformly with a radiation-sensitive film (e.g., a photoresist), and an exposing source (such as ultraviolet light, x-rays, or an electron beam) illuminates selected areas of the film surface through an intervening master template (e.g., a mask or reticle) to generate a particular pattern. The exposed pattern on the photoresist film is then developed with a solvent called a developer which makes the exposed pattern either soluble or insoluble depending on the type of photoresist (i.e., positive or negative resist). The soluble portions of the resist are then removed, thus leaving a photoresist mask corresponding to the desired pattern on the silicon wafer for further processing.

Projection lithography is a powerful and important tool for integrated circuit processing. As feature sizes continue to decrease, optical systems are approaching their limits caused by the wavelengths of the optical radiation being utilized. A recognized way of reducing the feature size of circuit elements is to image them lithographically with radiation of a shorter wavelength. "Soft" x-rays (a.k.a., extreme ultraviolet (EUV) radiation) having a wavelength range of about 50 to 700 Angstroms (i.e., about 5 to 70 nm) is now being investigated as an alternative photolithography methodology for next generation integrated circuits in an effort to achieve the desired smaller feature sizes.

Figure 1:
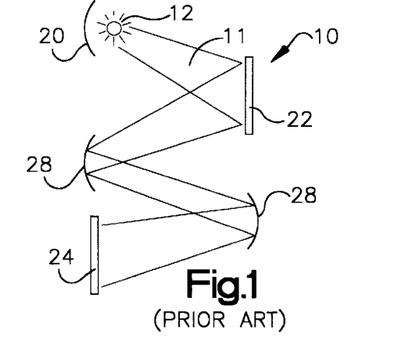
FIG. 1 is a perspective view of a prior art EUV reflective lithography system.

EUV lithography may be carried out, for example, in an EUV lithography system as illustrated in prior art FIG. 1. EUV radiation 11 is generated, for example, by a light source 12. A reflective condenser optical system 20 collects the EUV radiation 11 and projects the radiation 11 onto a reflective reticle 22.

The reticle 22 contains a pattern which is to be transferred to a photoresist-covered substrate 24. The reflective reticle 22 reflects a portion of the EUV radiation 11 and absorbs another portion of the EUV radiation 11 corresponding to the pattern thereon. The reflected EUV radiation 11 therefore carries the desired pattern to a reflective imaging system 28 (e.g., a series of high precision mirrors) which projects a de-magnified or reduced image of the reticle pattern onto the resist-coated substrate 24. The entire reticle pattern is generally exposed onto the substrate 24 by scanning the reticle 22 and the substrate 24 (e.g., a step and scan exposure system).

The reflective reticle 22 of prior art FIG. 1 is an important component in the EUV lithography system 10. Unlike conventional UV lithography systems which predominately use refractive optics, many EUV lithography systems, such as the system 10 of prior art FIG. 1, utilize reflective optics. Consequently, the reticle 22 is a reflective reticle and therefore reflects the incident EUV radiation 11 to form a pattern as opposed to transmitting portions of the radiation therethrough. An exemplary reflective reticle 22 is illustrated in prior art FIG. 2. The reflective reticle 22 includes a substrate 40 such as silicon or glass having a reflective layer 42 formed thereon. The reflective layer 42 is typically a multilayer coating which is designed to reflect the EUV radiation with a high efficiency (e.g., about 65% or more). The reflective layer 42 is covered with a capping layer 43 formed of amorphous silicon of about 40 to about 200 Angstroms which serves to protect the reflective layer 42. The reflective layer 42 and the capping layer 43 are covered with a buffer layer 44 (e.g., silicon dioxide) which may be used to protect the reflective layer 42 and help prevent oxidation of the reflective layer 42 during subsequent processing or pattern repair. Lastly, a thin layer of EUV absorptive material (e.g., silver, tungsten, gold, tantalum, titanium, lead, polyimide, etc.) is deposited and patterned with the buffer layer 44 to form the desired reticle pattern 46.

As will become apparent in the discussion that follows, the prior art EUV mask 22 suffers from several disadvantages associated with a reworking of the EUV mask 22. Thus there is a need in the art for an EUV mask which may be easily reworked numerous times without negatively impacting the performance of the EUV mask.

SUMMARY OF THE INVENTION

The present invention relates to a reworkable reflective EUV mask that contains an absorbing layer material which may be removed without substantially impacting an underlying reflective layer of the EUV mask.

According to one aspect of the present invention, a reworkable EUV mask includes a reflective layer overlying a mask substrate. A buffer layer and an absorbing layer overlie the reflective layer in that order. The absorbing layer is formed of a material which can be removed from the EUV mask without adversely impacting the reflectivity of the underlying reflective layer in the event of an uncorrectable absorbing layer defect or a recycling of the reflective layer.

Preferably, the absorbing layer is a material which exhibits a high etch selectivity with respect to the underlying reflective layer or capping layer, such as a silicon oxynitride or a silicon nitride. Consequently, when the absorbing layer is to be removed, a wet etch may be performed that removes the absorbing layer without substantially affecting the underlying reflective layer or capping layer. In addition, the absorbing material is such that the wet etch chemically reacts therewith, thus breaking down the absorbing material and substantially eliminating any reflectivity degradation due to residual absorbing layer material on the reflective layer.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 2:
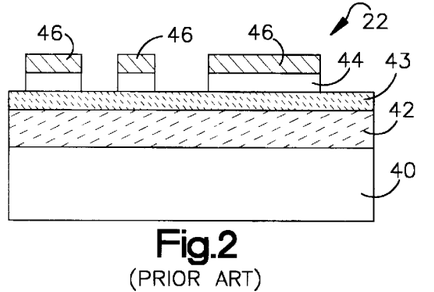
FIG. 2 is a cross section diagram illustrating a prior art reflective EUV reticle.

Turning now to the Figures, the reflective EUV mask 22 of prior art FIG. 2, consisting of the substrate 40, the reflective coating 42, the capping layer 43, the buffer layer 44 and the absorbing layer 46, is an important component in the EUV lithography system 10. The reflective coating 42 typically contains many individual reflective layers (and for this reason is often called a multilayer film or coating) which must be substantially defect free in order to provide the high reflectance needed for a high-throughput, cost-effective lithography system. The reflective coating 42 may include, for example, eighty (80) layers of alternating molybdenum and silicon, each having a thickness of about 3–4 nm. Because the reflectivity of the reflective coating 42 is an important performance parameter and since defects in the multilayer coating 42 negatively impact the reflectivity of the mask 22, the manner in which the EUV mask 22 is fabricated is important. For example, the individual layer thicknesses of the reflective layer 42 must be controlled to within about ±0.1 nm in order to ensure the constructive interference between the various layers which is necessary to provide the high reflectivity.

Because the formation of a high quality reflective layer 42 (i.e., low defect, high reflectivity) is difficult, requiring high precision manufacturing controls, EUV reticle or mask blanks are extremely expensive (e.g., about $15,000 dollars). Consequently, EUV reticle blanks (consisting primarily of the underlying substrate 40 and the reflective layer 42) are not thrown away, but rather are recycled (often called "reworked"). Such reworking of an EUV mask 22 may occur in instances where an uncorrectable defect has been produced in the absorbing layer pattern 46.

In many cases, absorbing layer defects may be corrected via a subsequent subtractive process, such as through focused ion beam repair. In such a process, a focused ion beam having an energy of about 5–30 keV is directed toward portions of the absorbing layer 46 to thereby remove those portions which do not coincide with the intended pattern (thus called a subtractive process). In some cases, however, such as after the underlying buffer 44 is patterned, a defect (such as a particulate defect) that exists on the capping layer 43 can not be repaired using a subtractive process because any such repair would damage the reflective layer 42. Consequently, in such an instance the entire absorbing layer 46 is typically removed and a new absorbing layer is deposited and patterned on the EUV mask 22 to provide a defect free pattern thereon.

In another instance, after an EUV mask 22 having a particular pattern thereon is no longer needed or desired, the mask 22 is reworked instead of being thrown away by removing the absorbing layer 46 so that a new absorbing layer may be deposited and patterned in accordance with a new desired pattern. In either of the above cases (i.e., uncorrectable defects or complete mask recycling), reworking the EUV mask 22 includes the complete removal of the patterned absorbing layer 46. The removal of the absorbing layer 46 in prior art EUV masks 22, however, has several problems associated therewith as will be discussed in greater detail below.

Figure 3:
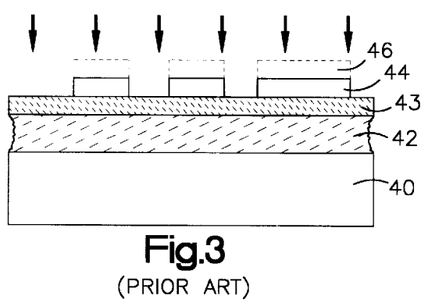
FIG. 3 is a cross section diagram illustrating a rework etching of a prior art EUV mask and degradation of the reflective layer due to poor etch selectivity between the absorbing layer and the reflective layer.
Figure 4A:
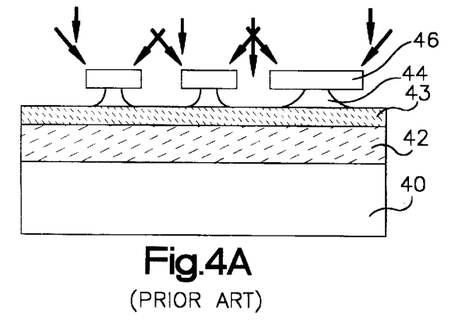
FIG. 4a is a cross section diagram illustrating an undercutting rework technique of a prior art EUV mask.

As discussed above, since the absorbing layer 46 in prior art EUV masks 22 is a heavy metal, the removal of such an absorbing layer 46 by etching using, for example, a dry etch chemistry, removes the absorbing layer 46, but also undesirably attacks the sides of the silicon and molybdenum layers in the underlying reflective layer 42 (i.e., the etch is not selective). Thus such a rework technique negatively impacts the reflectivity of the reflective layer 42, as illustrated in prior art FIG. 3. Such removal techniques therefore have been substantially abandoned and instead the removal of the absorbing layer 46 is typically achieved by performing a wet etch which does not react with the absorbing layer 46, but instead attacks the underlying buffer layer 44 (which is typically an oxide), as illustrated in prior art FIG. 4a.

Figure 4B:
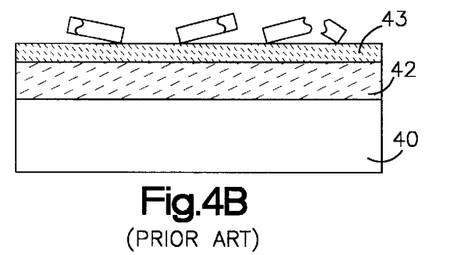
FIG. 4b is a cross section diagram illustrating the residual pieces of the absorbing layer of a prior art EUV mask after an undercutting rework process.
Figure 4C:
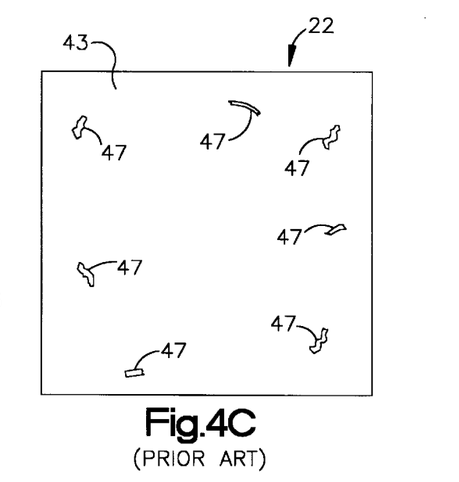
FIG. 4c is a plan view of a prior art EUV mask after an undercutting rework process, wherein residual pieces of the absorbing layer remain on the EUV mask surface and degrade the reflectivity of the mask.

The prior art wet etch process is isotropic and attacks the buffer layer 44 (oxide) as opposed to the absorbing layer 46. As the wet etch removes the buffer layer 44, the support for the overlying patterned absorbing layer 46 deteriorates, as illustrated in prior art FIG. 4a, and the patterned absorbing layer 46 breaks apart and is carried away by the wet etchant, as illustrated in prior art FIG. 4b. This prior art removal technique, however, does not break down or otherwise attack the absorbing layer 46. Consequently, some pieces 47 of the absorbing layer 46, due to their mass, may not be fully carried away during the buffer layer etch step and may be left behind on top of the reflective layer 42 and the capping layer 43, as illustrated in prior art FIG. 4c, which is a plan view of the EUV mask 22. Thus the prior art removal technique which involves the undercutting of the absorbing layer 46 undesirably results in defects on top of the reflective layer 42. Therefore the absorbing layer removal techniques of prior art EUV masks 22 undesirably decrease the reflectivity of the masks 22 and may cause an incremental degradation in EUV mask performance each time the mask is reworked.

The present invention overcomes the above discussed problems of the above prior art. The following is a detailed description of the present invention made in conjunction with the attached Figures, wherein like reference numerals will refer to like elements throughout. The present invention includes a reworkable reflective EUV mask having a new material for the absorbing layer which allows the EUV mask to be reworked numerous times without a substantial degradation in the reflectivity of the mask.

The absorbing layer is composed of a material which exhibits a high etch selectivity of the absorbing layer with respect to the reflective layer or capping layer of the EUV mask. Consequently, during a rework of the EUV mask, the absorbing layer may be directly removed by etching without substantially affecting the reflective layer, thus maintaining the reflectivity of the mask. In addition, because the high etch selectivity of the absorbing layer material with respect to the reflective layer allows for the direct etching of the absorbing layer, the absorbing layer reacts with the etchant and breaks down, thus allowing the absorbing layer material to be readily removed from the surface of the mask. Consequently, residual broken pieces and other remnants of the absorbing layer do not exist and thus will not remain on the mask surface, thus substantially eliminating reflectivity degradation due to residual pieces of absorbing layer on the reflective layer as in the prior art.

According to a preferred embodiment of the present invention, the absorbing layer is composed of a silicon oxynitride or a silicon nitride. Such materials at, for example, thicknesses of about 1,000 Angstroms to about 1,500 Angstroms, provide an EUV radiation absorbency of about 90%. The silicon oxynitride and silicon nitride materials exhibit excellent etch selectivities with respect to the reflective layer or capping layer and thus may be removed readily during rework with a standard or conventional wet etch. Such a wet etch chemically reacts the silicon oxynitride or silicon nitride and breaks the materials down while not reacting in a significant manner with the reflective layer, thus providing for a reworking of the EUV mask without affecting the reflectivity of the mask. In addition, since the etch reacts with and breaks down the silicon oxynitride or silicon nitride absorbing layer, the materials are substantially completely removed during the etch process and reflectivity degradation due to residual fragments as in prior art undercutting processes is substantially eliminated.

Figure 5:
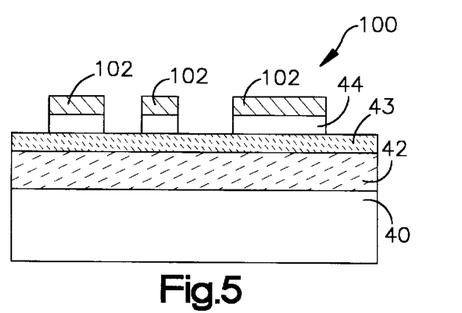
FIG. 5 is a cross section diagram of an EUV mask having a new absorbing layer material according to the present invention.

Referring now in detail to the Figures, FIG. 5 is a cross section diagram illustrating an EUV mask 100 according to the present invention. The EUV mask 100 includes the substrate 40, the reflective layer 42, the capping layer 43, and the buffer layer 44 of prior art FIG. 2. Although the capping layer 43 may be referred to as a separate layer, it is often considered part of the reflective layer 42 and serves to prevent oxidation of the reflective layer (e.g., preventing the oxidation of molybdenum).

The EUV mask 100 of FIG. 5, however, differs from the EUV mask 22 because the absorbing layer 102 is composed of a different material. Unlike the absorbing layer 46 of prior art EUV mask 22, the absorbing layer 102 of the present invention is not a heavy metal such as aluminum or the like which does not exhibit a high rework etch selectivity with respect to the reflective layer 42 or capping layer 43 (e.g., an etch selectivity of about 1:1). Instead, the absorbing layer 102 of the present invention has a substantially high etch selectivity with respect to the reflective layer 42 or capping layer 43 (e.g., an etch selectivity of about 30:1 or more). Therefore in stark contrast to prior art absorbing layer materials such as heavy metals which could not be etched in a rework step, but rather required an undercutting technique, the absorbing layer 102 of the present invention may be etched readily during a rework operation without the etch step impacting the underlying reflective layer 42 or capping layer 43. Consequently, the EUV mask 100 of the present invention may be reworked without causing a degradation in the reflectivity of the reflective layer 42.

In addition, the high etch selectivity of the absorbing layer material 102 with respect to the reflective layer 42 or capping layer 43 allows an etch to be used to remove directly the absorbing layer 102 instead of using an undercutting removal technique (i.e., an indirect removal) for rework as in the prior art. During the etching of the absorbing layer 102 to rework the EUV mask 100, the wet etchant reacts with and breaks down the absorbing layer 102. Consequently, large pieces of residual absorbing layer material do not exist to cause potential reflectivity degradation as in the prior art undercutting method. The removal of the new absorbing layer 102 therefore does not create residual fragments and thus eliminates any reflectivity degradation associated with such fragments. The absorbing layer 102 of the present invention therefore allows the EUV mask 100 to be reworked numerous times without damage to the reflective layer 42.

According to a preferred embodiment of the present invention, the absorbing layer is SiON (a silicon oxynitride) or $Si_3N_4$ (a silicon nitride). Both materials are well characterized (i.e., their etch characteristics, etc.) and may be readily dry etched during patterning to form the desired pattern for the absorbing layer 102. For example, the materials (i.e., SiON or $Si_3N_4$) may be dry etched in a $CHF_3$ plasma which is substantially selective with respect to the underlying reflective layer 42 or capping layer 43 (about 9:1 or more). In addition, both materials exhibit excellent wet etch rework selectivities, for example, about 30:1 to about 1,000:1 or more.

Previously, neither SiON nor $Si_3N_4$ have been considered as absorbing layer materials perhaps because for a given material thickness, the EUV radiation absorption for such materials is less than the absorption exhibited by heavy metal materials. However, by increasing the film thickness of the absorbing layer 102 to about 1,000 Angstroms to about 1,500 Angstroms, it has been found that the absorption of the SiON or $Si_3N_4$ for EUV radiation is about 90% or more, which is sufficient for reflective EUV mask operation and, in fact, may be desirable to take advantage of phase shifting effects in phase shift masks.

Figure 6:
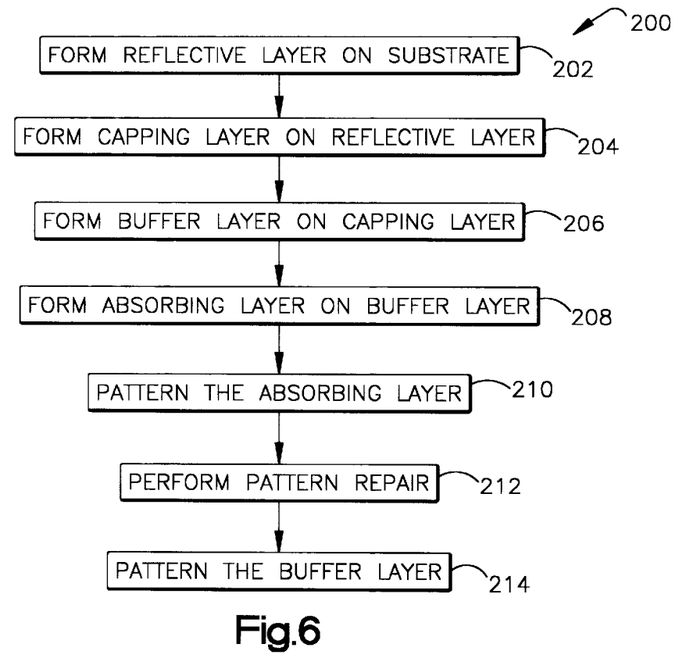
FIG. 6 is a flow chart illustrating a method of forming an EUV mask according to the present invention.
Figure 7A:
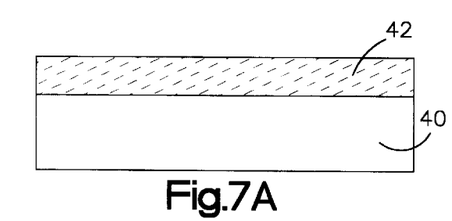
FIGS. 7a–7f are cross section diagrams illustrating the steps of forming an EUV mask in according with the method of FIG. 6.

FIG. 6 is a flow chart illustrating a method 200 of manufacturing the reflective EUV mask 22 according to the present invention which will be discussed in conjunction with the cross section diagrams of FIGS. 7a–7f. The method 200 includes a step 202 of forming the reflective layer 42 on the substrate 40, as illustrated in FIG. 7a. Any type of reflective coating may be utilized, however, according to a preferred embodiment of the present invention, the reflective layer 42 is a multilayer molybdenum/silicon film. Preferably, the reflective layer 42 comprises eighty (80) thin film layers, including forty (40) layer pairs of molybdenum and silicon with a bilayer period of about 7 nm. The individual thickness of the molybdenum layers is about 3 nm and the individual thickness of the silicon layers is about 4 nm, respectively. The individual thin film thicknesses are preferably controlled tightly to be within their target thickness ±0.1 nm in order to ensure constructive interference between the layers to achieve a high reflectivity of about 65% or more.

Because the thicknesses of the various layers within the reflective layer 42 must be tightly controlled in order to provide the desired high reflectivity, it is preferred that the substrate 40, upon which the reflective layer 42 will be formed, is substantially flat (i.e., have a low surface roughness of ±0.1 nm or less). For example, if the substrate 40 has peaks and valleys on its surface which approach 0.1 nm rms, the uneven surface will be transferred through the various individual layers, thus negatively impacting the constructive interference within the reflective layer 42 and undesirably diminishing the reflectivity. For this reason it is preferred that the substrate 40 be a flat material such as silicon, gallium arsenide or a super-polished quartz.

As discussed above, the reflective layer 42 is preferably a multilayer film consisting of molybdenum and silicon. Alternatively, other materials may be utilized to form a multilayer reflective film. Generally, a combination of materials which have a substantial difference in their refractive indices is desired. In addition, a transition metal element having a high melting point is often used as a material for a low refractive index layer and a semiconductor element is used as a high refractive index layer. Exemplary transition metal elements may include scandium, titanium, vanadium, chromium, iron, nickel, cobalt, zirconium, niobium, technetium, ruthenium, rhodium, hafnium, tantalum, tungsten, rhenium, osmium, iridium, platinum, copper, palladium, silver, or gold. Similarly, exemplary semiconductor materials may include a carbide, nitride or oxide of silicon, boron, beryllium or aluminum. In yet another alternative embodiment of the present invention, other reflective materials may be utilized and any such reflective material or materials is contemplated as falling within the scope of the present invention.

According to a preferred embodiment of the present invention, the individual layers of the reflective layer 42 are formed via sputtering in a dual source RF or DC magnetron sputtering system or via ion beam sputtering. As is well known by those skilled in the art, a magnetron sputtering system increases the deposition rate over DC or RF diode type sputtering systems by utilizing magnetic fields to confine the secondary electrons near the sputtering target surface to thereby increase the number of electrons that cause ionizing collisions. Alternatively, however, other type sputtering systems may be utilized as well as other deposition/formation techniques such as chemical vapor deposition, etc. Any such method of forming the reflective layer 42 is contemplated as falling within the scope of the present invention.

Figure 7B:
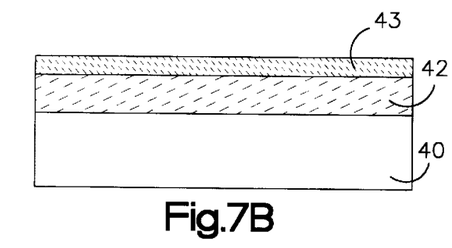

Once the reflective layer 42 is formed on the substrate 40 at step 202, the capping layer 43 is formed over the reflective layer 42 at step 204, as illustrated in FIGS. 6 and 7b. The capping layer 43 has a thickness of about 40 Angstroms to about 70 Angstroms and more preferably a thickness of about 60 Angstroms to about 70 Angstroms (i.e., about 6–7 nm). The capping layer 43 is provided to minimize the oxidation of the molybdenum in the reflective layer 42 during subsequent processing. Of course, if a different type of material or materials are used for the reflective layer 42 which are not prone to oxidation or if such oxidation does not significantly impact the reflectivity of the reflective layer 42, the capping layer 43 may be omitted. According to a preferred embodiment of the present invention, the capping layer 43 is composed of amorphous silicon and is formed via low pressure chemical vapor deposition (LPCVD). Alternatively, however, the capping layer 43 may be formed via other deposition techniques, for example, sputtering, etc., and any such deposition technique is contemplated as falling within the scope of the present invention.

Figure 7C:
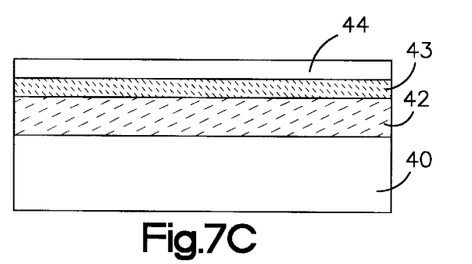

After formation of the capping layer 43 at step 204, the method 200 continues at step 206 by forming the buffer layer 44 on the capping layer 43, as illustrated in FIGS. 6 and 7c. The buffer layer 44 is preferably silicon dioxide ($SiO_2$), however, other materials such as silicon nitride ($Si_3N_4$) may also be used and any such material which provides the functionality described below may be utilized and are contemplated as falling within the scope of the present invention. The buffer layer 44 is used primarily to protect the capping layer 43 and the reflective layer 42 from damage in the event that a subsequent absorbing layer defect repair step is necessary. That is, if during a subsequent absorbing layer patterning step, a correctable defect occurs, a repair process using, for example, a focused ion beam having an energy of about 30 keV is used to remove the defects. The buffer layer 44 serves to absorb the ion beam energy and prevent ions from penetrating into the capping layer 43 and reflective layer 42, respectively, thus protecting the multilayers and maintaining the reflectivity of the EUV mask 100. According to a preferred embodiment of the present invention, the buffer layer 44 is made as thin as possible to minimize the height of the "pattern stack" which will be described in greater detail infra. Preferably, when silicon dioxide is utilized as the buffer layer 44, the thickness of the buffer layer is about 500 Angstroms to about 1,000 Angstroms.

Preferably, the buffer layer 44 is formed using LPCVD, however, the oxide may alternatively be formed in various ways such as via sputtering or thermal growth. LPCVD, however, is preferred because other deposition steps (e.g., formation of the capping layer 43 and the absorbing layer 102) may also be performed using LPCVD, thus simplifying the EUV mask fabrication process. In addition, LPCVD is preferred because it can be performed at low temperatures which is advantageous in maintaining the integrity of the underlying reflective layer 42.

Figure 7D:
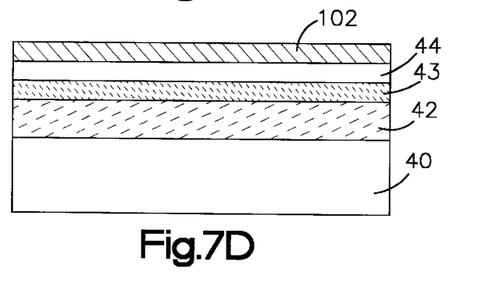

After the formation of the buffer layer 44 at step 206, the method 200 continues at step 208 by forming the absorbing layer 102 on the buffer layer 44, as illustrated in FIGS. 6 and 7d. As discussed above, the absorbing layer 102 differs from prior art heavy metal absorbing layers by exhibiting a high etch rate selectivity with respect to the underlying reflective layer 42 for both dry etching (which is used for the patterning of the absorbing layer 102) and wet etching (which is used in the reworking the EUV mask 100). Preferably, the absorbing layer 102 is SiON or $Si_3N_4$, however, other materials which provide sufficiently high absorption of the EUV radiation (e.g., preferably about 80% or more and more preferably about 90% or more) and a sufficiently high etch selectivity with respect to the reflective layer 42 or capping layer 43 (e.g., about 30:1 to about 1,000:1 or more, and more preferably about 100:1 or more) may be utilized. Any such material which meets the above performance criteria is contemplated as falling within the scope of the present invention.

For SiON or $Si_3N_4$, the thickness of the absorbing layer is preferably about 1,000 Angstroms to about 1,500 Angstroms in order to provide an EUV radiation absorption of about 90% or more. With the above thickness, the resulting "pattern stack" (after later patterning) is sufficiently short to minimize any reduction in linewidth control due to reflective radiation shadowing. Alternatively, however, for other materials, the thickness of the absorbing layer 102 may vary and thus a wide range of thicknesses is contemplated as falling within the scope of the present invention. Preferably, the absorbing layer 102 is formed using LPCVD, however, other deposition techniques may also be utilized and are contemplated as falling within the scope of the present invention.

Figure 7E:
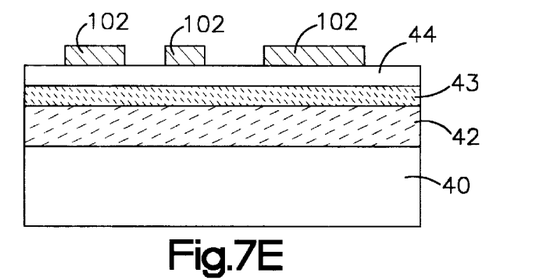

The method 200 continues at step 210, wherein the absorbing layer 102 is patterned to provide a desired mask pattern, as illustrated in FIGS. 6 and 7e. Depending on the material used in forming the absorbing layer 102 (e.g., SiON or $Si_3N_4$), a selected dry etch is performed to provide a substantially anisotropic profile in the absorbing layer 102. In addition, the dry etch chemistry (as well as the chamber pressure, flow rate, temperature, etc.) is preferably selected to maximize the etch selectivity with respect to the underlying reflective layer 42. For example, SiON may be etched anisotropically and with a high selectivity with respect to the reflective layer 42 using a $CHF_3$ plasma etch chemistry. Further, $Si_3N_4$ may be etched anisotropically and with high selectivity with respect to the reflective layer using a $CHF_3$ plasma etch chemistry. As is well known by those skilled in the art, the plasma etch is effectuated by depositing a photoresist, exposing the photoresist in accordance with a desired pattern, developing the exposed photoresist and using the remaining photoresist pattern as a mask.

After the dry etching of the absorbing layer 102 to obtain the desired EUV mask pattern, a pattern inspection and repair is performed at step 212. The pattern inspection is preferably performed optically in order to compare whether the completed pattern conforms with the intended pattern design. Such pattern inspection may be performed via optical techniques or other conventional techniques as may be desired. If one or more portions in the patterned absorbing layer 102 contain defects which are correctable with a subtractive type repair process, then such a process, for example, focused ion beam repair, is performed to removed the undesired portions of absorbing material which do not conform with the intended mask pattern.

Figure 7F:
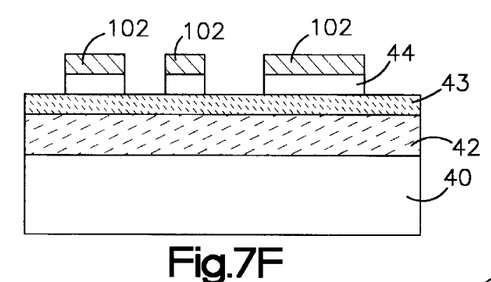

After any necessary pattern repair is complete at step 212, the method 200 continues at step 214 by patterning the buffer layer 44, as illustrated in FIGS. 6 and 7f. The patterning step 214 is preferably performed using a selected anisotropic dry etch. Similar to step 210, the dry etch chemistry as well as other etching process variables are preferably selected to maximize the etch selectivity with respect to the reflective layer 42. For example, a $CHF_3$ dry etch chemistry may be used. After step 214, the EUV mask 100 is complete and may be used as a reflective mask in EUV photolithography systems. Because the thickness of the patterned absorbing layer 102 is sufficient to provide an EUV radiation absorption of about 90% or more, the mask 100 desirably provides good linewidth resolution and critical dimension control.

Figure 8:
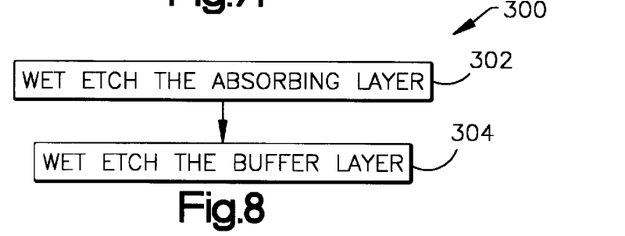
FIG. 8 is a flow chart illustrating a method of reworking an EUV mask according to the present invention.
Figure 9A:
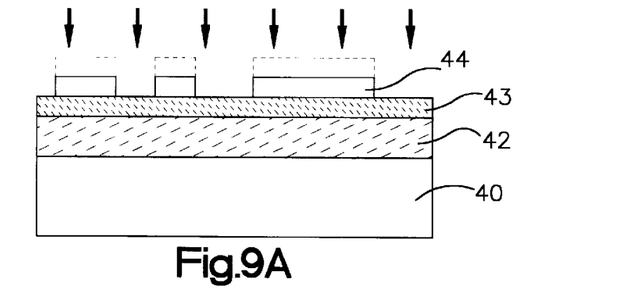
FIGS. 9a–9b are cross section diagrams illustrating the steps of reworking an EUV mask in accordance with FIG. 8.
Figure 9B:
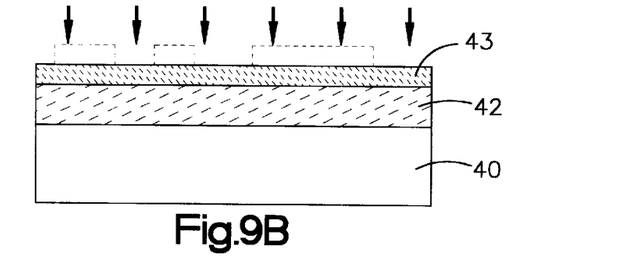

If an uncorrectable defect is detected during the pattern inspection and repair step 212, or if the mask 100 is to be reworked to make a new mask pattern, a method 300 for reworking the EUV mask 100 is performed, as illustrated in FIGS. 8 and 9a–9b. The method 300 begins at step 302 by wet etching the absorbing layer 102. The wet etch step 302 is highly selective with respect to the reflective layer 42. In addition, the etch step 302 directly attacks or reacts with the absorbing layer material, thus breaking the material down and eliminating the possibility of reflectivity degradation due to residual absorbing material fragments. A variety of wet etchants may be employed in the wet etch step 302. The particular etchant will depend on the nature of the absorbing material that is being used. For example, if the absorbing layer 102 is SiON, an exemplary etchant is a phosphoric acid based compound which exhibits a selectivity of about 30:1 or a hydrofluoric acid based compound which exhibits a selectivity of about 1,000:1 with respect to the capping layer 43. Alternatively, if the absorbing layer 102 is $Si_3N_4$, an exemplary etchant is a phosphoric acid or a hydrofluoric acid based compound.

Once the absorbing layer 102 is removed at step 302, the buffer layer 44 is removed at step 304 via a wet etch. Similar to step 302, the etchant is preferably selected to maximize the selectivity with respect to the underlying reflective layer 42. For example, if the buffer layer 44 is $SiO_2$, an HF etchant having a selectivity of about 10,000:1 with respect to the capping layer 43 may be employed.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A reworkable EUV mask, comprising:
   a substrate;
   a reflective layer overlying the substrate, wherein the reflective layer includes a capping layer to protect the reflective layer from oxidation; and
   an absorbing layer overlying the capping layer for absorbing radiation which is incident thereon, wherein the absorbing layer exhibits a substantially high etch selectivity with respect to the capping layer.

2. The EUV mask of claim 1, wherein the absorbing layer comprises silicon oxynitride or silicon nitride.

3. The EUV mask of claim 2, wherein the absorbing layer has a thickness of about 1,000 Angstroms to about 1,500 Angstroms.

4. The EUV mask of claim 1, further comprising a buffer layer disposed between the capping layer and the absorbing layer.

5. The EUV mask of claim 4, wherein the buffer layer comprises a silicon oxide or a silicon nitride.

6. The EUV mask of claim 4, wherein the buffer layer has a thickness of about 500 Angstroms to about 1,000 Angstroms.

7. The EUV mask of claim 1, wherein the substrate comprises silicon or glass.

8. The EUV mask claim 1, wherein the reflective layer comprises a plurality of film pairs, and wherein one of the layers in the film pairs comprises molybdenum and the other comprises silicon.

9. The EUV mask of claim 8, wherein the reflective layers comprise forty pairs of molybdenum and silicon, wherein the molybdenum layers are each about 3 nm thick and the silicon layers are each about 4 nm thick.

10. The EUV mask of claim 1, wherein the capping layer comprises amorphous silicon having a thickness of about 70 Angstroms.

11. The EUV mask of claim 1, wherein an absorption of the absorbing layer is about 90%.

12. The EUV mask of claim 1, wherein the etch selectivity of the absorbing layer with respect to the capping layer comprises a rework selectivity of about 30:1 or more.

13. The EUV mask of claim 12, wherein the rework selectivity is about 100:1.

14. The EUV mask of claim 1, wherein the etch selectivity of the absorbing layer with respect to the capping layer comprises a patterning selectivity of about 9:1 or more.

15. A reworkable EUV mask, comprising:
- a substrate;
- a reflective layer overlying the substrate, wherein the reflective layer includes a plurality of film pairs, wherein a first film in each film pair is selected from the group consisting of: scandium, titanium, vanadium, chromium, iron, nickel, cobalt, zirconium, niobium, technetium, ruthenium, rhodium, hafnium, tantalum, tungsten, rhenium, osmium, iridium, platinum, copper, palladium, silver, and gold, and wherein a second film in each film pair is selected from the group consisting of: a carbide, nitride and oxide of silicon, boron, beryllium or aluminum, and wherein the reflective layer includes a capping layer for protecting the reflective layer from oxidation;
- a buffer layer overlying the capping layer; and
- an absorbing layer overlying the buffer layer, wherein the absorbing layer has a substantially high etch selectivity with respect to the capping layer, thereby allowing the absorbing layer to be removed during a reworking of the EUV mask without substantially impacting a reflectivity of the reflective layer.

16. The EUV mask of claim 15, wherein the absorbing layer comprises silicon oxynitride or silicon nitride.

17. The EUV mask of claim 15, wherein the etch selectivity of the absorbing layer with respect to the capping layer comprises a rework selectivity of about 30:1 or more.

18. The EUV mask of claim 17, wherein the rework selectivity is about 100:1.

19. The EUV mask of claim 15, wherein the etch selectivity of the absorbing layer with respect to the reflective layer comprises a patterning selectivity of about 9:1 or more.

20. A method of reworking an EUV mask, having a substrate, a reflective layer including a capping layer for protecting the reflective layer from oxidation, and an absorbing layer, comprising etching the absorbing layer, wherein the etching exhibits a substantially high selectivity with respect to the capping layer.

21. The method of claim 20, wherein etching the absorbing layer comprises wet etching with an etchant of a phosphoric acid based compound or a hydrofluoric acid based compound, wherein the etch selectivity of the absorbing layer with respect to the reflective layer is about 30:1 or more.

* * * * *

UNITED STATES PATENT AND TRADEMARK OFFICE
CERTIFICATE OF CORRECTION

PATENT NO.:     6,013,399

DATED:          January 11, 2000

INVENTOR(S):    Khanh B. Nguyen

It is certified that error appears in the above-identified patent and that said Letters Patent is hereby corrected as shown below:

Column 1, line 51, after the word 'system', please insert the numeral --10--.

Column 3, line 30, please change the word "according" to --accordance--.

Column 8, line 41, please delete the word "the" (2nd occurrence).

Column 9, line 27, please delete the word "removed" and insert the word --remove--.

Signed and Sealed this

Eighth Day of August, 2000

*Attest:*

Q. TODD DICKINSON

*Attesting Officer*          Director of Patents and Trademarks